United States Patent [19]

Shanefield et al.

[11] 4,444,848

[45] Apr. 24, 1984

[54] ADHERENT METAL COATINGS ON RUBBER-MODIFIED EPOXY RESIN SURFACES

[75] Inventors: Daniel J. Shanefield, Princeton Township, Mercer County; Fred W. Verdi, Lawrence Township, Mercer County, both of N.J.

[73] Assignee: Western Electric Co., Inc., New York, N.Y.

[21] Appl. No.: 337,054

[22] Filed: Jan. 4, 1982

[51] Int. Cl.[3] ............................................. C23F 1/02
[52] U.S. Cl. ........................................ 428/624; 428/626; 428/675; 428/680; 428/926; 428/618; 428/621; 428/625; 428/611; 427/304
[58] Field of Search .............. 428/624, 416, 418, 626, 428/926; 174/68.5; 156/150; 204/192 E, 192 EC, 192 C; 427/307

[56] References Cited

U.S. PATENT DOCUMENTS

| | | |
|---|---|---|
| Re. 29,820 | 10/1978 | Konicek ............................ 204/43 R |
| 3,296,099 | 1/1967 | Dinella ................................. 204/15 |
| 3,585,010 | 6/1971 | Luce et al. ........................ 428/926 |
| 3,679,472 | 7/1972 | Crosby et al. ......................... 17/2 |
| 3,990,926 | 11/1976 | Konicek ............................ 204/43 R |
| 4,031,313 | 6/1977 | Franz et al. ........................ 428/418 |
| 4,056,642 | 11/1977 | Saxena et al. ....................... 427/84 |
| 4,085,022 | 4/1978 | Wechsung et al. ............. 204/192 E |
| 4,100,312 | 7/1978 | Lombardo et al. ................ 428/418 |
| 4,105,118 | 8/1978 | Williams ............................ 428/418 |
| 4,110,147 | 8/1978 | Grunwald et al. ................ 428/418 |
| 4,113,578 | 9/1978 | Del Monte .......................... 204/15 |
| 4,115,185 | 9/1978 | Carlson et al. ..................... 156/634 |
| 4,121,007 | 10/1978 | Kobayashi et al. ................ 428/201 |
| 4,129,848 | 12/1978 | Frank et al. ........................ 338/308 |
| 4,135,988 | 1/1979 | Dugan et al. ......................... 204/15 |
| 4,148,945 | 4/1979 | Bangs et al. ........................ 427/304 |
| 4,153,529 | 5/1979 | Little et al. ..................... 204/192 EC |
| 4,160,045 | 7/1979 | Longshore ........................... 427/38 |
| 4,166,018 | 8/1979 | Chapin ............................ 204/192 R |
| 4,176,142 | 11/1979 | Lewis et al. ........................ 525/342 |
| 4,193,849 | 3/1980 | Sato ................................... 204/38 B |
| 4,344,996 | 8/1982 | Banks et al. .................... 204/192 EC |
| 4,351,697 | 9/1982 | Shanefield et al. ................ 427/307 |
| 4,353,954 | 10/1982 | Yamaoka et al. .................. 428/418 |

FOREIGN PATENT DOCUMENTS 6153796  11/1981  Japan ................................ 428/418

OTHER PUBLICATIONS

D. J. Levy et al., *Plating & Surface Finishing*, Jun. 1979, pp. 68, 70, 71.

Luke R. Volpe et al., *Electronic Packaging and Production*, May 1981, pp. 69, 70, 72, 73, 74, 75.

*Primary Examiner*—Veronica O'Keefe
*Attorney, Agent, or Firm*—J. F. Spivak

[57] ABSTRACT

A method of forming adherent metallized coatings on a substrate which is useful for the manufacture of printed circuit boards as well as other metal coated articles involves providing the substrate with a rubber-modified epoxy surface or coating, sputter etching at least 50 A. from the surface followed by vacuum depositing an adherent thin metal film of Cr, Ni, Ni-V alloy, Pt, Pd or Ti onto the substrate. Another metal layer is then provided over the adherent thin film.

6 Claims, 6 Drawing Figures

ADHERENT METAL COATINGS ON RUBBER-MODIFIED EPOXY RESIN SURFACES

TECHNICAL FIELD

This invention relates to the manufacture of adherent metal coatings on polymer surfaces and more particularly to the formation of such coatings on epoxy surfaces.

BACKGROUND OF THE INVENTION

In many applications, it is desirable to provide strong adherent metal layers on a polymer substrate. Examples of such uses are widely diversified. For example, adherent metal coatings on polymer substrates can be used in printed circuit boards in the electronics, telecommunications, computer and other industries for creating conductive paths on interconnector devices, or it may be used merely as a radio interference barrier. Such coatings also have applications in the manufacture of certain types of credit cards, video disks and for decorative coatings.

Various methods have been employed for providing metal coatings on polymer surfaces. Such methods include lamination by means of an adhesive, electroless plating, and vacuum metallization. The latter method includes vacuum evaporation, sputter deposition and ion plating. While vacuum metallization has become a desirable and cost efficient method of applying metallic coatings onto polymer substrates, the adhesion of such films to the substrates is often less than adequate, especially when metallizing durable high performance polymers such as epoxy resins. The adhesion problem often becomes particularly critical where the vacuum metallized layer is further processed by electroless metal plating or electroplating to increase the thickness of the metallized layer. In such cases, the adhesion of the vacuum metallized film must withstand the environment and temperatures of subsequently employed plating baths.

SUMMARY OF THE INVENTION

A substrate having a rubber-modified or highly unsaturated epoxy polymeric surface is first treated to remove any weak boundary layers on the surface. A thin adherent base film of a metal selected from titanium, chromium, nickel, nickel-vanadium alloy, palladium or platinum is then vacuum deposited on the treated surface. The thin layer acts as a glue or adhesion promoting layer for a substantially thicker film of a primary metal which is deposited over the thin base film.

It should be understood that the metallized surface as described above may be provided as a blanket metallization over the entire surface of the substrate or may be provided over only portions of the substrate so as to depict a predetermined metallized pattern on the substrate. Alternatively, a pattern may be formed by various processing steps well known in the art subsequent to either a blanket vacuum deposition of the thin base film or subsequent to blanket electroless plating, electroplating or vacuum deposition of the primary metal.

DETAILED DESCRIPTION

Figure 1A:
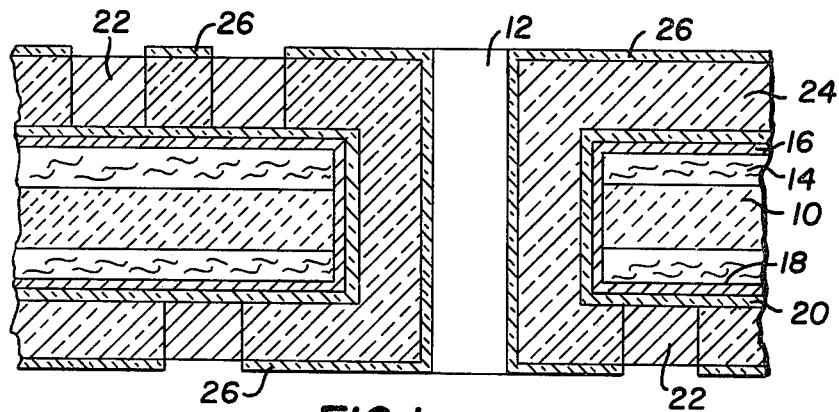
FIGS. 1a-1c are partial, elevational, cross-sectional views of a printed circuit board at various stages during one manufacturing process.

For convenience, the invention will be described in terms of preparing bare printed circuit boards and finished printed circuit boards by additive and semiadditive processing. However, it should be understood that the invention extends to many other uses other than printed circuit boards and is suitable for any use wherein an adherent metal coating is applied over a suitable epoxy polymeric substrate.

In general, the invention comprises treating the surface of the substrate to be metallized so as to remove any weak boundary layers from the surface which inhibits adhesion and then vacuum depositing a thin adherent base film of a metal selected from Ti, Ni, Ni-V alloy, Cr, Pd, or Pt and then applying a thicker coating such as by means of vacuum metallization, electroless or electroplating techniques, or a combination thereof to form a thicker metal layer over the thin base film.

It has unexpectedly been found that the novel process is unique for rubber-modified epoxy or highly unsaturated epoxy surfaces in that highly adherent metal films (films having 90° peel strengths of at least 8 lbs. per inch) cannot be formed over other polymers by this method. Attempts to metallize other polymer substrates, e.g., epoxies without rubber or without a high degree of unsaturation, polycarbonates, acrylonitrile-butadiene-styrene, lacquer and polyacrylates were unsuccessful. Unexpectedly, the only substrates which appear to be particularly suited to the formation of an adherent metal coating ($\geq 8$ lbs./in. peel strength) by means of this invention are the aforementioned type of epoxy resin surfaces. In the past, such epoxy polymers were not amenable to vacuum metallization of adherent films. An example of suitable rubber-modified epoxy resins are those which contain butadiene acrylonitrile rubber in the formulation. The rubber is generally present as a dispersed separate phase in the epoxy. An example of a highly unsaturated epoxy is one that has at least $5\frac{1}{2}$ weight percent of carbon-to-carbon double bonds based upon the total weight of the polymer excluding phenyl ring unsaturated carbon atoms, e.g., Epon 872, a commercially available epoxy resin flexibilized by prereaction with a dimer acid which has unsaturation and is incorporated in the polymer chain. The dimer acid has the formula

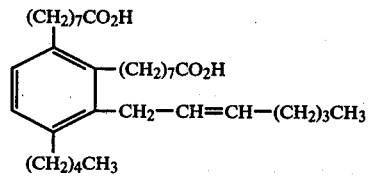

In order to remove the weak boundary layer which is generally present on such substrates, one may employ sputter etching techniques or mechanical abrasion. Sputter etching is preferred and at least about 50 A. of the surface should be removed. It may be noted that alternatively as much as $10^7$ A. may be removed such as by mechanical abrasion if desired. The thin base film is generally deposited to a thickness in the order of 1,000 A. and typically from 100 A. to 3,000 A. although thicker films may be employed. Any vacuum metallization technique is suitable. For example, one may use vacuum evaporation, sputter deposition or ion plating to form the thin base film; sputter deposition or ion plating being preferred.

In the manufacture of printed circuits as well as in the manufacture of other products, it has become desirable to eliminate complex steps, where possible, for the reasons of cost savings and also to eliminate or alter steps which may potentially cause environmental problems. In the case of the manufacture of printed circuit boards by either subtractive or additive processing as is described in U.S. Pat. Nos. 3,673,680, 3,296,099, or 3,679,472 which are incorporated herein by reference, chemical solutions are required to either treat the substrate to make it conductive for electroless deposition, or acidic and corrosive etching solutions are required to etch thick copper layers (such as in the subtractive techniques) in order to form the printed circuits. Further, other wet chemical techniques are needed to sensitize surfaces in the additive processing techniques. In accordance with the instant invention, a simplified method is presented which is environmentally cleaner and provides a metal coating on an epoxy polymer surface having an adhesion at least equal to that of prior art techniques, (i.e., $\geq 5$ lbs./in peel strength). By employing the novel method, printed circuits can be formed by additive or semiadditive techniques which require little or no etching and which reduce the use of solvents and various oxidizing agents. Examples of some printed circuit board structures are shown in the accompanying FIGS.

In accordance with the novel method for making a printed circuit board, one starts with a substrate member 10 such as an epoxy or fiberglass-epoxy member provided with spaced through-holes 12 therein and which preferably has a rubber-modified epoxy coating 14 on its surface typically about 0.002 inches thick. The rubber-modified epoxy may, for example, be selected from any of the compositions disclosed by R. B. Lewis and T. A. Giversen in U.S. Pat. No. 4,176,142 which is incorporated herein by reference. We have found that such surfaces have a weak boundary layer which prevents strong adhesion by vacuum metallized coatings. This boundary layer at the surface of the substrate is removed by preferably placing the substrate in a sputter etch vacuum apparatus so as to remove at least 50 A. of the outermost surface of the polymer. Either RF or DC sputter etching may be employed. Typically, for RF sputter etching, a wattage in the order of 500 watts at 13 to 14 MHz with an argon pressure of from 5 to 100 microns (approximately 10 microns being preferred) is suitable. Usual etch time in order to etch at least 50 A. from the surface is approximately 3 minutes under these conditions. It should be understood that the conditions for sputter etching are given merely by way of example and the actual conditions for sputter etching are not critical. Subsequent to sputter etching, a thin adherent film 16, preferably in the order of 100 A., e.g., 30-200 A. of a metal selected from the group consisting of Cr, Ni, Ni-V alloy, Pd, or Pt is vacuum deposited such as by means of well known sputtering or ion plating techniques such as are described in U.S. Pat. No. 4,166,018 issued to J. S. Chapin or in "Vacuum Metalizing," Metal Finishing by P. R. Forant, November, 1979, pages 17-20, both of which are incorporated herein by reference. This is preferably done without breaking the vacuum after completing sputter etching. After vacuum deposition, which provides a metal-polymer interface 18 having superior adhesion, additional metal 20, typically copper for printed circuit boards, can be deposited by means such as by electroplating, electroless plating or vacuum evaporation onto the previously vacuum deposited thin metal layer. This second layer is generally substantially thicker than the thin adhesion promoting metal film 16. When electroless plating is employed the thin adherent base metal film 16 is preferably Cr and when electroplating is to be employed to build up the primary layer, a thin adherent base layer 16 of Ni or Ni-V alloy is preferred.

It may be noted that the prior art, such as U.S. Pat. Nos. 4,121,007 and 4,193,849, has claimed that good adhesion can be obtained by sputtering, ion plating or otherwise vacuum depositing metals such as copper directly onto polymers for constructing useful articles such as printed circuits without the need for applicants' initial steps. However, we have found that this is not true when a high performance polymer, e.g., epoxy, is to be coated. We have unexpectedly discovered that by employing a rubber-modified or highly unsaturated epoxy surface, removing at least 50 A. of the outermost portion of this surface, and providing a thin intermediate adhesive or glue layer selected from a specific small group of metals, consistently good adherent films can be formed. While the elimination of these steps is sometimes possible, the results without the novel steps are variable from one sample to another and therefore unreliable. Furthermore, the bonds achieved without the novel steps as taught herein are excessively subject to degradation from the long term effects of atmospheric humidity and of agents which are often necessary during later processing steps in the manufacture of completed articles such as printed circuits. Examples of agents which adversely affect metals deposited by prior art vacuum deposition techniques, while they do not substantially affect vacuum deposited metals formed in accordance with this invention, are such things as the heat which is used to harden screen printing ink during patterning and the methylene chloride or other solvent used for stripping of photoresist as well as electroless and electroplating baths.

It has unexpectedly been found that the novel treatment for insuring good adhesion of the metal coating on the polymer substrate is not only limited to the use of an epoxy substrate having a surface which contains a rubber or an epoxy having a high degree (at least 5.5 weight percent) of unsaturated carbon atoms excluding aromatic double bonds as previously indicated, but it has also been found to be of extreme importance to remove at least 50 A. of the surface of the substrate in order to attain the desired adhesion. Unless this minimal amount of substrate is removed by either sputter etching or mechanical means as previously set forth, desired adhesion is not reliably attainable. It may be noted that mechanical abrasion requires that substantially more than 50 A. be removed to insure elimination of the weak boundary layer.

It has further been discovered that the requisite adhesion is only attained with the thin metal bonding or glue layers as set forth herein. The use of other metals as a substitute for the specified glue layer metals results in poor adhesion. For example, if one attempts to use metals such as copper, aluminum or gold as the thin adhesion promoting layer, adhesion is poor.

A typical suitable epoxy surface for processing in accordance with this invention is an epoxy resin which contains from 5 to 15 weight percent of an acrylonitrile butadiene rubber such as Goodrich X-8 or X-13 rubbers. It may further be noted that while the thin metal glue layer 16 is generally applied in thicknesses of the order of 100 A., thicknesses of from 30 A. to 10,000 A. are also suitable and have resulted in metal coatings having more than adequate adhesion to the substrate. It has further been found that processing parameters such as sputtering voltage and argon pressure are not critical. It may be noted that while roughening and/or deglossing is known as a method for promoting adhesion of a coating on a substrate, the removal of 50 A. or more of the surface by the preferred method of sputter etching does not necessarily roughen or degloss the surface. Analysis of the surface by means of x-ray photoelectron spectroscopy indicates that the sputter etching step removes a hydrocarbon from the surface which exposes the underlying rubber containing material. It may also be noted that while the ABS polymer, which is a frequently used plastic, contains rubber, the novel process does not result in a strongly adherent metal coating on such a polymer substrate. Consequently, it presently appears that the novel process is unique for rubber-modified epoxy and epoxies having a high degree of unsaturation in the polymer chain.

The novel process can be employed in the manufacture of printed circuit boards by means of various types of processing including ultra thin clad processing, semiadditive processing and additive processing.

In accordance with the manufacture of printed circuit boards by means of ultra thin clad processing, typically a fiberglass-epoxy substrate 10 without copper cladding is powder coated with a rubber-modified epoxy resin 14 on each side to a thickness of approximately 0.002 inch thick to provide an adhesion-promoting surface. The coated panels are then drilled to provide through-holes 12 and scrub-deburred. In a vacuum metallization chamber, three things are then done: (a) sputter-etch cleaning so as to remove at least 50 A. of the outer surface, (b) deposition of approximately one microinch layer of an adhesion promoting metal 16 selected from Ni, Ni-V alloy, Pd, Pt, Cr and T, and (c) deposition of about a 40 microinch thick copper layer 20. The adhesion promoting layer and copper layer coat the insides of the holes and the two major surfaces of the substrate.

At this point, the circuit board is similar to a purchased subtractive thin clad panel, except that the metallization is only about 40 microinch thick instead of the usual 525 microinches of copper.

Figure 1B:
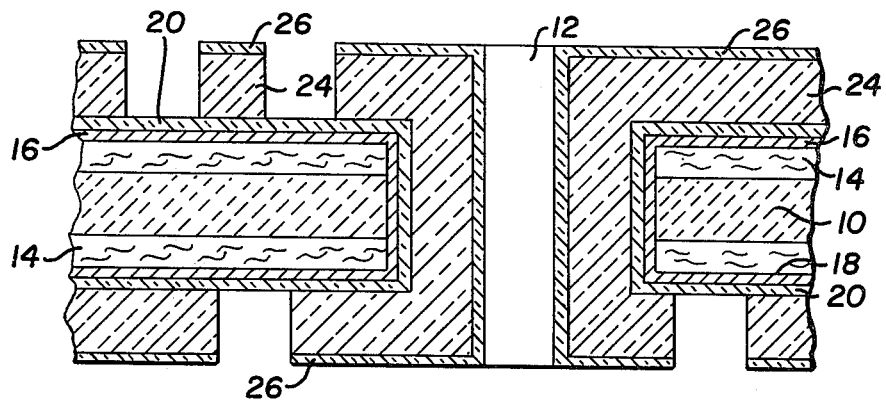
Figure 1C:
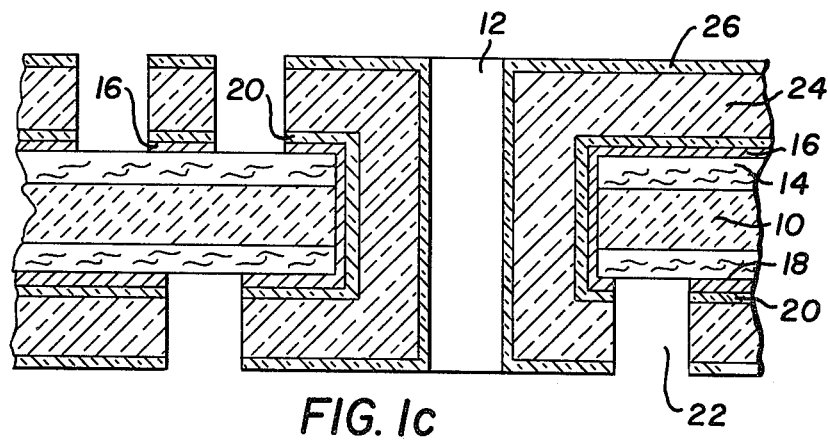

The next steps are essentially the same as those used for standard subtractive material, which include the application, exposure and development of photoresist 22 for obtaining the desired pattern, electroplating a thick copper layer 24 to build up the desired circuit pattern, preferably plating a tin alloy etch resist 26 over the copper 24, stripping the photoresist 22 (FIG. 1b) and etching of the thin clad copper 20 and underlying adhesion promoting metal layer 16 (FIG. 1c). By this method, etching times can be reduced in order to minimize the undercutting of fine lines due to the extremely thin initial copper clad layer. In addition, the amount of etchant required is minimized.

In accordance with the partially additive processing, the same procedure is followed as described in the ultra thin clad processing method except that the thick copper layer 24 is built up by electroless plating instead of electroplating and no tin alloy plating 26 is used. This process offers the advantages of high yield of fine line due to the fact that electroless full plate offers thickness uniformity from panel center to panel edge which is not generally attainable by electroplating. Also, the resist tends to prevent uncontrolled lateral growth of conductors and the ultra thin initial metallization etches quickly, minimizing undercutting and the amount of etchant required.

Figure 2A:
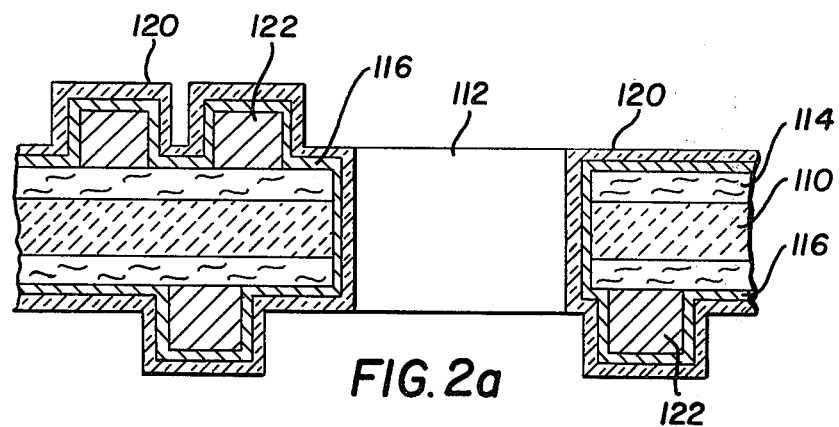
FIGS. 2a-2c are partial, elevational, cross-sectional views of a printed circuit board at various stages during a second manufacturing process.
Figure 2B:
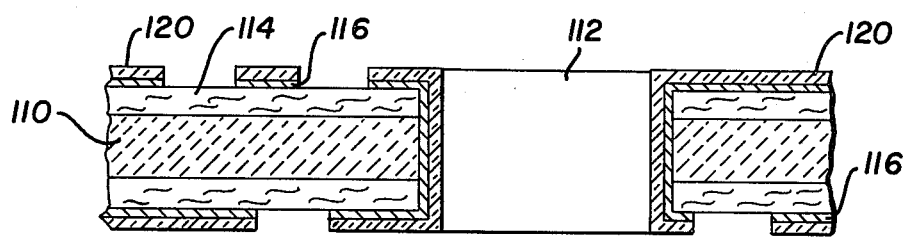
Figure 2C:
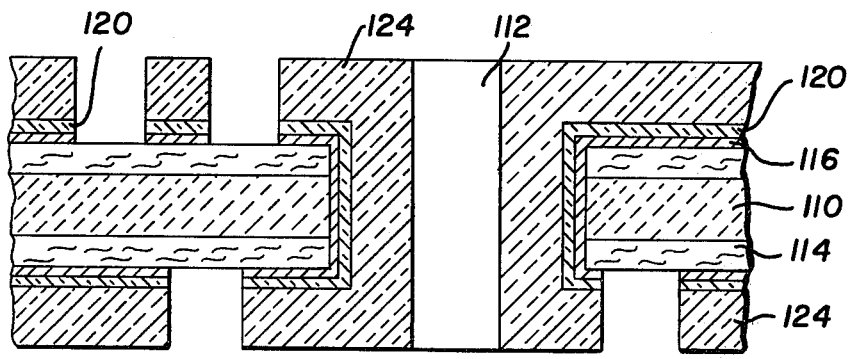

Referring to FIGS. 2a–2c, in accordance with fully additive processing, the substrate 110 would be powder coated 114, drilled to form through-holes 112 and scrub-deburred as described above with reference to ultra thin clad processing. A photoresist pattern 122 in the negative of the desired circuit pattern is then applied to the coated substrate. The substrate is then placed in a vacuum chamber where it is sputter etch cleaned so as to remove at least 50 A. from the surface of the substrate coating 114 and an adhesion promoting metal layer 116 is then deposited over the entire substrate in a thickness of approximately 1 microinch followed by the vacuum deposition of a 10 microinch layer of copper 120. It may be noted that the copper layer 120 may be applied by flash electroless plating techniques instead of vacuum deposition if desired. Also, other metals such as Ni, can be used in place of copper. Only 10 microinches of copper are necessary since electrical conductivity is not of import due to the fact that electroplating is not required. The photoresist 122 is then stripped, which removes the thin metal layers 116 and 120 from regions where the resist had been. However, the vacuum metallized adhesion promoting layer 116 and copper layer 120 thereover are not removed from regions where there was no resist. The thickness of the remaining metal is then built up to the full desired thickness of approximately 0.0014 inches by electroless copper 124 deposition. Any thickness which gives suitable electrical conductivity for the circuit is suitable.

Printed circuit boards made in accordance with this invention generally exhibit 90° peel strengths of at least 8 pounds per inch. It should be noted that such high peel strengths are not obtained with other substrates or where the process is altered such as where the weak surface layer is not removed prior to vacuum metallization of the thin adhesion promoting metal layer or where another metal is substituted for the metals taught as useful for the thin metal adhesion promoting layer. Further, as long as the above factors are conformed to, large variations in process operating parameters are acceptable. For example, curing times and temperatures for the rubber-modified epoxy coating material are not critical. It has also been determined that large variations in curing agent amount and type, the amount and type of rubber material added to the epoxy, the thickness of the adhesion promoting metallic layer, the sputter etch and sputter deposition or other vacuum deposition parameters and the like can be varied over substantial ranges and are not critical. More specifically, peel strengths of greater than 8 pounds per inch and typically greater than 10 pounds per inch were obtainable when using a rubber-modified epoxy material intentionally overcured at 200° C. for 45 minutes as compared to the usual curing temperature and time of 175° at 20 minutes, or when the amount of curing agent was varied from 1% through 8.5%, or when the amount of rubber in the epoxy formulation was varied between 4.5 and 16%. It was also found that fairly long delays of 6 hours or more between weak boundary layer removal by sputter etching and the step of sputter metallization did not adversely effect the peel strengths. This indicates that the weak boundary layer material being removed is substrate material itself rather than merely adsorbed surface gas.

It should be noted that magnetron sputtering, is the preferred sputtering method since it is much more efficient than non-magnetically enhanced modes. However, magnetron sputtering cannot be used to deposit metals such as nickel which are magnetic. Such magnetic metals would attract magnetism to the substrate distorting the optimum field configuration. We have discovered that nickel, which is a generally preferred metal adhesion promoting material, can still be employed with magnetron sputtering when used in the form of a non-magnetic alloy with 8 weight percent vanadium.

When employing the fully additive process as previously described, the thin metallic glue layer metallizations that were successful for the ultra thin clad processing and the partially additive processing did not give consistently good adhesion through the electroless buildup to 0.0014 inches of copper. In many cases the metals blistered during electroless deposition and peel strengths were less than 5 pounds per inch both before and after baking subsequent to deposition. Attempts to cure this problem by altering the electroless plating bath were unsuccessful. It was unexpectedly discovered together with a co-worker, however, that the attack causing reduction of adhesion by the electroless plating bath can be substantially completely alleviated by baking the substrate in air, for example, at about 120° C. for about 30 minutes prior to sputter etching. Preferably the material is not allowed to cool completely to room temperature between baking and sputter etching. It is hypothesized that this baking removes absorbed gases from the surface of the substrate. By placing the still warm substrate in the sputtering apparatus and pumping down prior to complete cooling, gases can be prevented from readsorbing on the surface. For example, substrates having a rubber-modified epoxy surface were first baked, and then placed warm in a sputtering apparatus and sputter etched, and then sputter metallized with chromium and removed from the vacuum apparatus. Thereafter, a 0.0014 inch copper layer was built-up by placing in a McDermid 9620 electroless plating bath. Peel strengths ranging between 8 to 10 pounds per inch were obtained. It is also preferred, but not necessary, to bake again subsequent to the completion of all vacuum metallization steps. Experiments done to seek alternatives to the baking as a solution for the blistering problem when the substrate is to be electrolessly plated failed to result in good adhesion. For example, placing the substrate in a desiccator for one week at room temperature followed by sputter etching and sputter metallization did not provide adequate adhesion. Similarly, placing the sample for an extended period, e.g., three hours in vacuum at $10^{-6}$ Torr at room temperature, also resulted in poor adhesion. Consequently, whenever electroless plating is used to further buildup the thickness of the metal pattern, a pre-bake is essential.

It has also been found that it is preferred in order to achieve more uniform plating of through-holes, that during vacuum metallization the substrate should be spaced from its carrier plate, spacings of from $\frac{1}{4}$-$\frac{3}{8}$ of an inch were preferred.

It is to be understood that the above-described embodiments are simply illustrative of the principles of the invention. Various other modifications and changes may be devised by those skilled in the art which will embody the principles of the invention and fall within the spirit and scope thereof.

What is claimed is:

1. An article of manufacture comprising:
   (a) a substrate having a surface of a rubber-modified epoxy resin, said surface having any weak boundary layer thereon essentially removed;
   (b) a thin adherent base metal film selected from the group consisting of Cr, Ni, Ni-V alloy, Pd, Pt, or Ti on said surface, said metal having been vacuum deposited on the surface; and
   (c) a thicker primary metal deposited over the base metal film said primary metal having a peel strength of at least 8 pounds/inch.

2. The article recited in claim 1 wherein said rubber-modified epoxy resin contains an acrylonitrile-butadiene type rubber.

3. The article recited in claim 1 wherein the weak boundary layer was removed by means of sputter etching at least 50 A. from the surface of the substrate.

4. The article recited in claim 3 wherein the thickness of the base metal is from 30 A. to 10,000 A.

5. The article recited in claim 3 wherein the thickness of the base metal film is in the order of 1,000 A.

6. The article recited in claim 1 wherein the primary metal is selected from the group consisting of copper, nickel or a mixture thereof.

* * * * *